US012570502B2

(12) United States Patent
Lee et al.

(10) Patent No.: US 12,570,502 B2
(45) Date of Patent: Mar. 10, 2026

(54) BRAKING UNIT AND TOWER LIFT

(71) Applicant: SEMES CO., LTD., Cheonan-si (KR)

(72) Inventors: Myung Jin Lee, Hwaseong-si (KR); Sang-Oh Kim, Seoul (KR); Hee Jae Byun, Yongin-si (KR); Na Hyun Lee, Ansan-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 648 days.

(21) Appl. No.: 17/692,539

(22) Filed: Mar. 11, 2022

(65) Prior Publication Data

US 2023/0286778 A1 Sep. 14, 2023

(51) Int. Cl.
B66B 5/18 (2006.01)
B66B 5/22 (2006.01)
H01L 21/687 (2006.01)

(52) U.S. Cl.
CPC .................. B66B 5/18 (2013.01); B66B 5/22 (2013.01); H01L 21/68764 (2013.01)

(58) Field of Classification Search
CPC ........ B66B 5/18; B66B 5/22; H01L 21/68764
See application file for complete search history.

(56) References Cited

U.S. PATENT DOCUMENTS

| | | | | |
|---|---|---|---|---|
| 2010/0158643 A1* | 6/2010 | Friedman | .......... | H01L 21/67775 |
| | | | | 414/222.01 |
| 2011/0226560 A1 | 9/2011 | Husmann | | |
| 2021/0300693 A1* | 9/2021 | Lee | .................. | H01L 21/67742 |

FOREIGN PATENT DOCUMENTS

| | | | |
|---|---|---|---|
| CN | 102849557 A | | 1/2013 |
| CN | 111039128 A | | 4/2020 |
| CN | 113471117 A | | 10/2021 |
| JP | 3611543 B2 | | 1/2005 |
| JP | 5-052374 B2 | | 10/2012 |
| JP | 5-319731 B2 | | 10/2013 |
| JP | 2014-508698 A | | 4/2014 |
| KR | 100901222 B1 | | 6/2009 |
| KR | 10-2012-0124561 A | | 11/2012 |
| KR | 1020130003974 A | | 1/2013 |
| KR | 10-2014-0013624 A | | 2/2014 |
| KR | 101698546 B1 | | 1/2017 |
| KR | 20180126828 A | * | 5/2017 |
| KR | 10-2017-0073840 A | | 6/2017 |
| KR | 10-2018-0065613 A | | 6/2018 |
| KR | 10-2018-0069389 A | | 6/2018 |
| KR | 10-2019-0021659 A | | 3/2019 |
| KR | 10-2019-0049412 A | | 5/2019 |
| KR | 200491485 Y1 | | 4/2020 |

(Continued)

OTHER PUBLICATIONS

Korean Notice of Allowance dated Mar. 22, 2023 issued in corresponding Korean Appln. No. 10-2020-0129619.

(Continued)

*Primary Examiner* — Glenn F Myers
(74) *Attorney, Agent, or Firm* — Harness, Dickey & Pierce, P.L.C.

(57) ABSTRACT

The present invention provides a tower lift. The tower lift includes: a rail module extended in a vertical direction; and a carriage module provided to be movable by a magnetic levitation method along the rail module, in which in the carriage module, a braking unit which brakes falling of the carriage module when power driving the tower lift is cut is installed.

9 Claims, 15 Drawing Sheets

(56) References Cited

FOREIGN PATENT DOCUMENTS

| KR | 20220046327 | A | * | 10/2020 |
| WO | WO-2005/105647 | A1 | | 11/2005 |

OTHER PUBLICATIONS

Japanese Office Action, dated May 30, 2023, issued in corresponding Japanese Patent Application No. 2022-035118.

Korean Office Action dated Jan. 20, 2023 issued in corresponding Korean Appln. No. 10-2020-0129619.

Chinese Office Action dated Nov. 27, 202, issued in corresponding Chinese Patent Application No. 202210277920.2 and English Translation thereof.

* cited by examiner

BRAKING UNIT AND TOWER LIFT

TECHNICAL FIELD

The present invention relates to a braking unit and a tower lift.

BACKGROUND ART

In general, a manufacturing line in a semiconductor or display manufacturing plant is composed of multiple layers. Equipment for performing processes, such as deposition, exposure, etching, ion implantation, and cleaning, may be disposed on each layer of the semiconductor manufacturing line. Equipment disposed on each layer may repeatedly perform a series of unit processes on a semiconductor wafer used as a semiconductor substrate or a glass substrate used as a display substrate.

In the meantime, the transfer of articles between the respective layers of the semiconductor manufacturing line, that is, the transfer of articles, such as semiconductor wafers or glass substrates, may be accomplished by a tower lift installed in a vertical direction through each layer.

A typical tower lift has a carriage module for transferring articles and a rail module for guiding the carriage module in a vertical direction. The rail module is provided with a drive belt, such as a timing belt, for elevating the carriage module. The timing belt is coupled with the carriage module to move the carriage module up and down. However, particles may be generated when the timing belt is driven in these typical tower lifts. For example, the timing belt is driven by friction with a pulley, and particles may be generated as the timing belt and the pulley rub against each other.

In order to solve the problem, it can be considered that the carriage module moves along the rail module in a magnetic levitation method. The carriage module may be moved in the vertical direction in a state in which the carriage module is not in contact with the rail module by the power generated by a linear motor installed in the carriage module or in the rail module, and is suspended in the air. In the case of a tower lift in which the carriage module moves along a rail module in a magnetic levitation method, there are no substrates, such as a timing belt or a rope, in the rail module, physically connected to the carriage module. Therefore, if the electricity driving the tower lift is cut off, the carriage module of the tower lift will fall (free fall).

SUMMARY OF THE INVENTION

The present invention has been made in an effort to provide a braking unit capable of braking free fall of a moving object when power driving a magnetic levitation vertical drive module is cut off.

The present invention has also been made in an effort to provide a braking unit and a tower lift capable of braking free fall of a carriage module when power driving the tower lift is cut off.

The object of the present invention is not limited thereto, and other objects not mentioned will be clearly understood by those of ordinary skill in the art from the following description.

An exemplary embodiment of the present invention provides a tower lift, comprising: a rail module extended in a vertical direction; and a carriage module provided to be movable by a magnetic levitation method along the rail module, in which in the carriage module, a braking unit which brakes falling of the carriage module when power driving the tower lift is cut is installed.

According to the exemplary embodiment, the braking unit may include: a braking body which is selectively in contact with the rail module and brakes falling of the carriage module; and a holding member which makes the braking body be selectively in contact with the rail module by holding the braking body only when the power is applied.

According to the exemplary embodiment, the braking body may be configured to be movable in an inclined direction with respect to the vertical direction, and include a braking pad provided to a surface facing the rail module.

According to the exemplary embodiment, the braking unit may further include a tension member which makes the braking body be in contact with the rail module by moving the braking body in an upwardly inclined direction when the power is cut.

According to the exemplary embodiment, the holding member may further include an electromagnet which generates magnetic force and holds the braking body so that the braking body is spaced apart from the rail module when the power is applied.

According to the exemplary embodiment, the braking unit may further include a base body of which a relative position to the carriage module is fixed, one end of the tension member may be fixed to a base body hooking part formed in the base body, and the other end of the tension member may be fixed to a braking body hooking part formed in the braking body.

According to the exemplary embodiment, the braking unit may further include a restoration member which returns the braking body to an original position by moving the braking body in a downwardly inclined direction after the braking body moves in an upwardly inclined direction and is in contact with the rail module.

According to the exemplary embodiment, the braking body may be provided to be rotatable about an axis of rotation horizontal to the ground, and have a cam shape asymmetric with respect to the axis of rotation, and be formed with a saw-tooth in an outer diameter that is in contact with the rail module according to the rotation of the braking body.

According to the exemplary embodiment, the braking unit may further include a tension member which makes the braking body be in contact with the rail module by rotating the braking body in a first direction when the power is cut.

According to the exemplary embodiment, the braking unit may further include a base body in which an arc-shaped guide groove is formed based on the axis of rotation, a guide protrusion inserted into the guide groove may be formed in the braking body, one end of the tension member may be fixed to a base body hooking part formed in the base body, and the other end of the tension member may be fixed to the guide protrusion.

According to the exemplary embodiment, the holding member may include: a holding head; and a solenoid which linearly moves the holding head, and the holding head may prevent the braking body from rotating in the first direction by holding the guide protrusion when the power is applied.

According to the exemplary embodiment, the braking unit may further include a restoration member which returns the braking body to an original position by rotating the braking body in a second direction that is a reverse direction of the first direction after the braking body rotates in the first direction and is in contact with the rail module.

According to the exemplary embodiment, the braking unit may include a first braking unit and a second braking unit, a first braking body that is the braking body of the first braking unit may be configured to be movable in an inclined direction with respect to the vertical direction, and includes a braking pad provided to a surface facing the rail module, a second braking body that is the braking body of the second braking unit may be provided to be rotatable based on an axis of rotation horizontal to the ground and has a cam shape asymmetric about the axis of rotation, and an outer diameter of the braking body that is in contact with the rail module according to the rotation of the braking body may have a saw-tooth shape.

According to the exemplary embodiment, the first braking unit may be installed at a higher position than the second braking unit.

Another exemplary embodiment of the present invention provides a braking unit which is installed in a moving object provided to be movable along a rail module extended in a vertical direction by a magnetic levitation method, and brakes emergency falling of the moving object when power moving the moving object is cut, the braking unit including: a braking body which is selectively in contact with the rail module and brakes falling of the moving object, is configured to be movable in an inclined direction with respect to the vertical direction, and includes a braking pad provided to a surface facing the rail module; a holding member which makes the braking body be selectively in contact with the rail module by holding the braking body only when the power is applied, and includes an electromagnet which generates magnetic force and holds the braking body so that the braking body is spaced apart from the rail module when the power is applied; and a tension member which makes the braking body be in contact with the rail module by moving the braking body in an upwardly inclined direction when the power is cut.

According to the exemplary embodiment, the braking unit may further include a base body fixed to the moving object, in which one end of the tension member may be fixed to a base body hooking part formed in the base body, and the other end of the tension member may be fixed to a braking body hooking part formed in the braking body.

According to the exemplary embodiment, the braking unit may further include a restoration member which returns the braking body to an original position by moving the braking body in a downwardly inclined direction after the braking body moves in an upwardly inclined direction and is in contact with the rail module.

Another exemplary embodiment of the present invention provides a braking unit which is installed in a moving object provided to be movable along a rail module extended in a vertical direction by a magnetic levitation method, and brakes emergency falling of the moving object when power moving the moving object is cut, the braking unit including: a braking body which is selectively in contact with the rail module to brake falling of the moving object, is provided to be rotatable about an axis of rotation horizontal to the ground, has a cam shape asymmetric with respect to the axis of rotation, and is formed with a saw-tooth in an outer diameter that is in contact with the rail module according to a rotation in a first direction; a holding member which makes the braking body be selectively in contact with the rail module by holding the braking body only when the power is applied, and includes a solenoid which prevents the braking body from rotating in the first direction when the power is applied; and a tension member which makes the a saw-tooth be in contact with the rail module by rotating the braking body in the first direction when the power is cut.

According to the exemplary embodiment, the braking unit further includes a base body in which an arc-shaped guide groove is formed based on the axis of rotation, in which a guide protrusion inserted into the guide groove may be formed in the braking body, one end of the tension member may be fixed to a base body hooking part formed in the base body, and the other end of the tension member may be fixed to the guide protrusion.

According to the exemplary embodiment, the braking unit may further include a restoration member which returns the braking body to an original position by rotating the braking body in a second direction that is a reverse direction of the first direction after the braking body rotates in the first direction and is in contact with the rail module.

According to the exemplary embodiment of the present invention, when power driving a magnetic levitation vertical driving module is cut, it is possible to brake free fall of a moving object.

Further, according to the exemplary embodiment of the present invention, when power driving the tower lift is cut, it is possible to brake free fall of the carriage module.

The effect of the present invention is not limited to the foregoing effects, and non-mentioned effects will be clearly understood by those skilled in the art from the present specification and the accompanying drawings.

DETAILED DESCRIPTION

Figure 1:
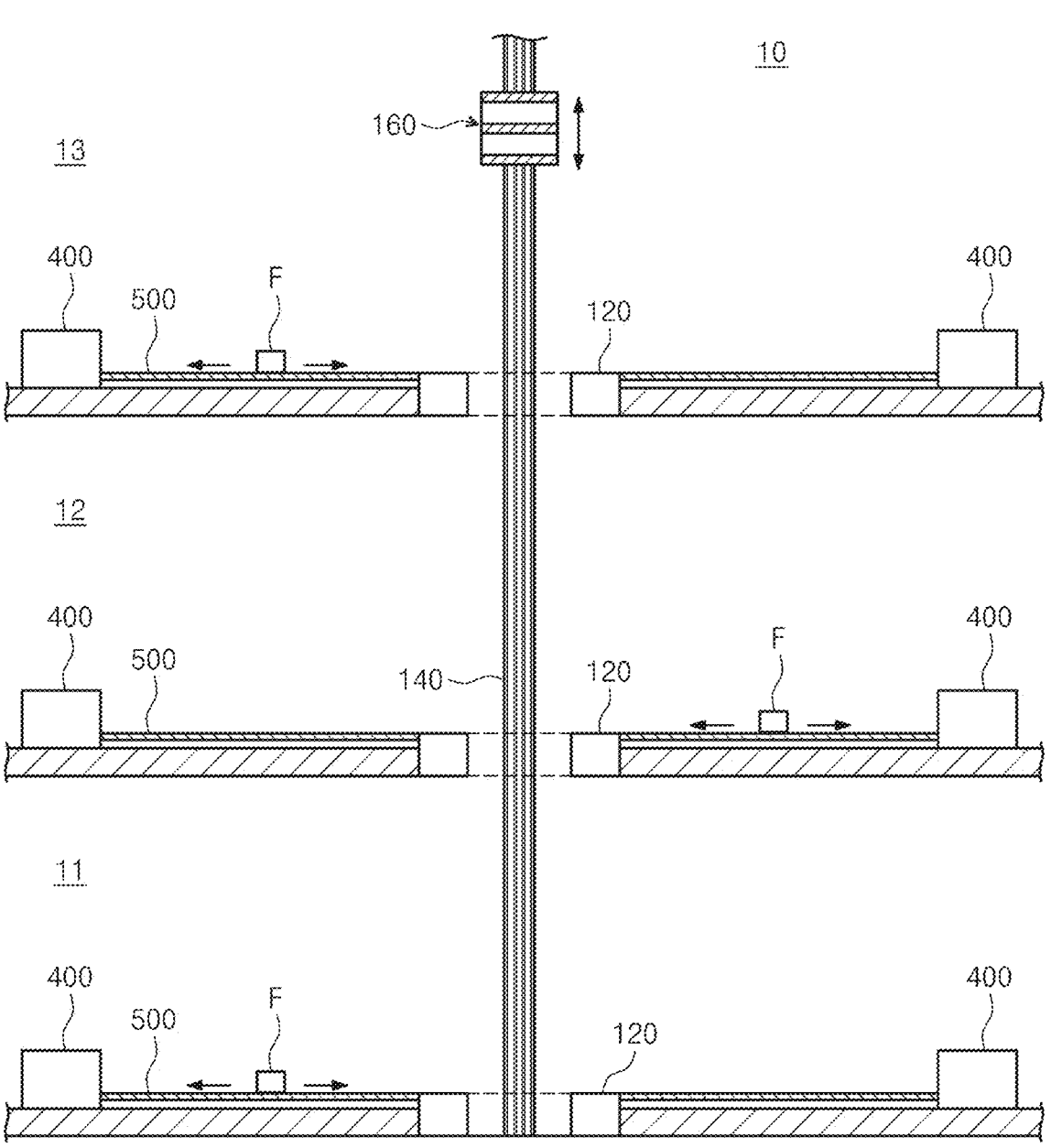
FIG. 1 is a diagram schematically illustrating a semiconductor manufacturing line in which a tower lift is installed according to an exemplary embodiment of the present invention.

Hereinafter, an exemplary embodiment of the present invention will be described more fully hereinafter with reference to the accompanying drawings, in which exemplary embodiments of the invention are shown. However, the present invention can be variously implemented and is not limited to the following embodiments. In addition, in describing an exemplary embodiment of the present invention in detail, if it is determined that a detailed description of a related well-known function or configuration may unnecessarily obscure the gist of the present invention, the detailed description thereof will be omitted. In addition, the same reference numerals are used throughout the drawings for parts having similar functions and actions.

Unless explicitly described to the contrary, the word "comprise" and variations such as "comprises" or "comprising" will be understood to imply the inclusion of stated elements but not the exclusion of any other elements. It will be appreciated that terms "including" and "having" are intended to designate the existence of characteristics, numbers, steps, operations, constituent elements, and components described in the specification or a combination thereof, and do not exclude a possibility of the existence or addition of one or more other characteristics, numbers, steps, operations, constituent elements, and components, or a combination thereof in advance.

Singular expressions used herein include plurals expressions unless they have definitely opposite meanings in the context. Accordingly, shapes, sizes, and the like of the elements in the drawing may be exaggerated for clearer description.

A tower lift according to a present exemplary embodiment may be used for transporting articles. In particular, the tower lift according to the present exemplary embodiment may transport a container in which an article is accommodated. The article may be a wafer, a glass substrate, or a reticle. Further, the container in which an article is accommodated may be a Front Opening Unified Pod (FOUP). Further, the container in which an article is accommodated may be a POD. Further, the container in which an article is accommodated may be a magazine for accommodating a plurality of printed circuit boards, a tray for accommodating a plurality of semiconductor packages, and the like.

FIG. 1 is a diagram schematically illustrating a semiconductor manufacturing line in which a tower lift is installed according to an exemplary embodiment of the present invention. Referring to FIG. 1, a semiconductor manufacturing line 10 may have a multilayer structure. For example, the semiconductor manufacturing line 10 may have a first layer 11, a second layer 12, and a third layer 13. However, the present invention is not limited thereto, and the multilayer structure of the semiconductor manufacturing line 10 may be variously modified.

The semiconductor manufacturing line 10 may be provided with a tower lift 100, a container storage part 400, a transport rail 500, and a semiconductor manufacturing device (not illustrated) performing a semiconductor manufacturing process.

The tower lift 100 (an example of a magnetic levitation vertical driving module) may transport a container F in which an article is accommodated between the respective layers 11, 12, and 13 of the semiconductor manufacturing line 10. The tower lift 100 may include a stage module 120, a rail module 140, and a carriage module 160.

The stage module 120 may be installed on a floor of each of the layers 11, 12, and 13 of the semiconductor manufacturing line 10. The stage module 120 may be coupled with the transport rail 500 that transports the container F to the container storage part 400. When the tower lift 100 transports the container F to each of the layers 11, 12, and 13, the container transported to each of the layers 11, 12, and 13 may be transported to the container storage unit 400 by the transport rail 500.

The rail module 140 may be extended in the vertical direction. The rail module 140 may be extended in the vertical direction between at least two layers of the semiconductor manufacturing line 10. The rail module 140 may guide the movement of the carriage module 160 which is to be described below. Further, the rail module 140 may move the carriage module 160, which is to be described below, in the vertical direction.

The carriage module 160 (an example of a moving object) may be configured to be movable along the rail module 140. For example, the carriage module 160 may be configured to be movable in the vertical direction along the rail module 140. The carriage module 160 may include a carriage 162 which transports an article. A plurality of carriage modules 160 may be provided. For example, the number of carriage modules 160 may be variously modified.

The carriage module 160 may include a seating shelf on which the container F in which the article is accommodated is seated. Contrary to this, the carriage module 160 may also have a robot that grips the container F. The carriage module 160 may be modified to various structures which are capable of moving the container F.

Hereinafter, the rail module 140 and the carriage module 160 according to the exemplary embodiment of the present invention will be described in detail.

Figure 2:
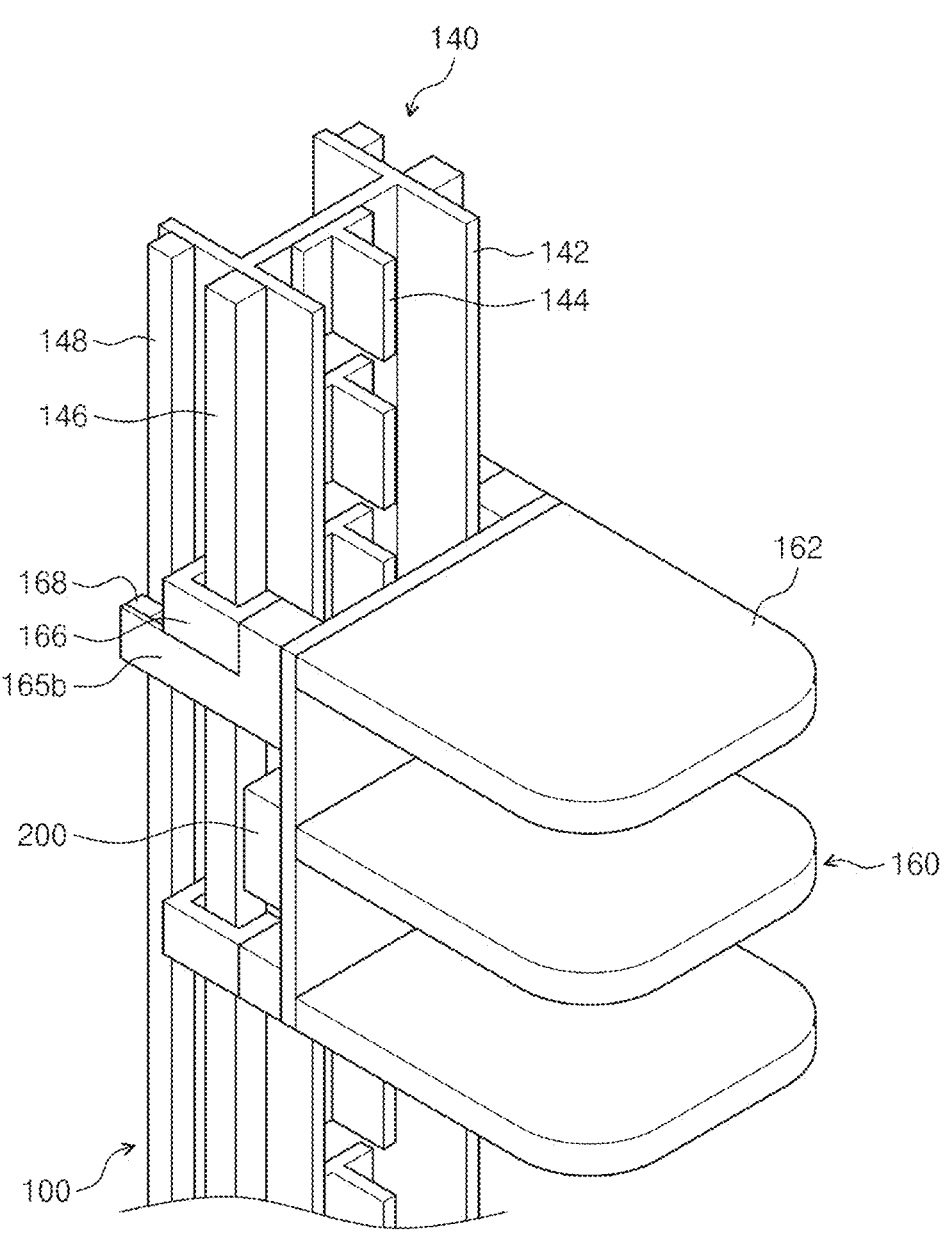
FIG. 2 is a perspective view illustrating a rail module and a carriage module of the tower lift according to the exemplary embodiment of the present invention.
Figure 3:
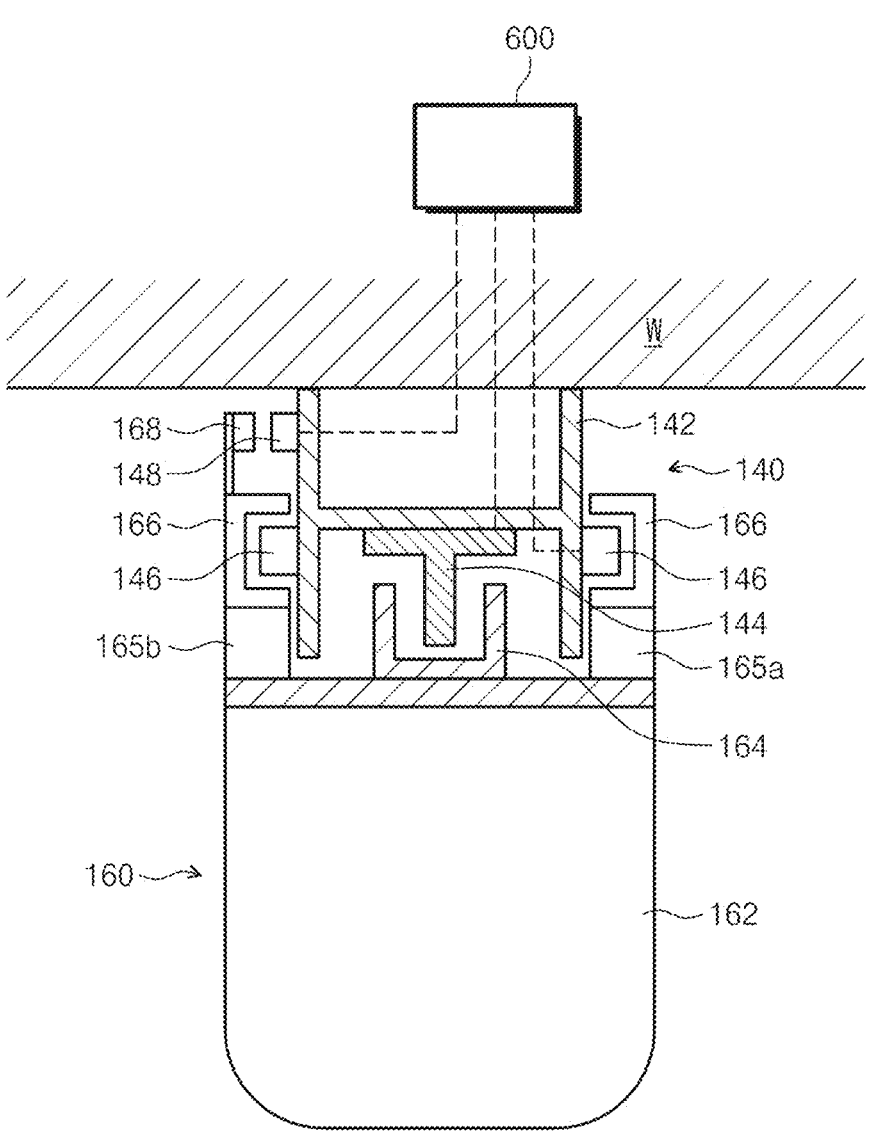
FIG. 3 is a plan cross-sectional view illustrating the rail module and the carriage module of the tower lift according to the exemplary embodiment of the present invention.

FIG. 2 is a perspective view illustrating the rail module and the carriage module of the tower lift according to the exemplary embodiment of the present invention, and FIG. 3 is a plan cross-sectional view illustrating the rail module and the carriage module of the tower lift according to the exemplary embodiment of the present invention.

Referring to FIGS. 2 and 3, the rail module 140 may include a frame 142, a linear motor coil 144, a guide rail 146, and a power transmitting unit 148.

The frame 142 may be extended in the vertical direction. A longitudinal direction of the frame 142 may be the vertical direction. The frame 142 may be fixedly installed on a wall W of the semiconductor manufacturing line 10. The frame 142 may be coupled with the linear motor coil 144, the guide rail 146, and the power transmitting unit 148, which are to be described below. The frame 142 may have an "H" shape as a whole when viewed from the top, but is not limited thereto, and the shape of the frame 142 may be variously modified.

The linear motor coil 144 may move the carriage 152 in the vertical direction by an interaction with a linear motor magnet 164, which is to be described below. The interaction may be due to magnetic force generated by the linear motor coil 144 and/or the linear motor magnet 164. The linear motor coil 144 may be installed in the frame 142. The linear motor coil 144 may be installed on a surface of the frame 142 facing the carriage module 160 when viewed from the top. The linear motor coil 144 may generally have a shape of "⊤".

Further, an interface line (not illustrated), such as a power line, may be connected to the linear motor coil 144. Further, a pair of linear motor coils 144 may be provided in plurality. The pair of linear motor coils 144 provided in plurality may be installed in the frame 142 while being spaced apart from each other in the vertical direction in which the frame 142 is extended.

The guide rail 146 may constrain some of the degrees of freedom of the carriage module 160. The guide rail 146 may constrain the remaining degrees of freedom of the carriage module 160, except for the degree of freedom of the vertical movement of the carriage module 160. The guide rail 146 may be spaced apart from the guide part 166 of the carriage module 160, which is to be described below, by repulsive force by magnetic force. An interface line (not illustrated), such as a power line, may be connected to the guide rail 146. Further, a gap sensor (not illustrated) is provided to any one of the guide rail 146 and the guide part 166, and the magnetic force may be controlled based on a measurement value measured by the gap sensor. Therefore, an interval between the guide rail 146 and the guide part 166 may be controlled to be substantially constant.

At least one guide rail 146 may be provided. For example, the plurality of guide rails 146 may be provided. Any one of the guide rails 146 may be installed on one surface of the frame 142, and another one of the guide rails 146 may be installed on the other surface of the frame 142. For example, any one of the guide rails 146 may be installed on one lateral wall of the frame 142, and another one of the guide rails 146 may be installed on the other lateral wall of the frame 142. Further, a longitudinal direction of the guide rail 146 may be the same as a longitudinal direction of the frame 142.

The power transmitting unit 148 may transmit power to a power receiving unit 168 of the carriage module 160. For example, the power transmitting unit 148 may be any one of the configurations of the contactless power supply (HID) that supplies power in a contactless manner. The power transmitting unit 148 may be installed on the frame 142. The power transmitting unit 148 may be installed in any one of the surfaces of the frames 142 in which the guide rail 146 is installed. For example, the power transmitting unit 148 may be installed on one lateral wall among the surfaces of the frame 142 in which the guide rail 146 is installed. An interface line (not illustrated), such as a power line, may be connected to the power transmitting unit 148.

The carriage module 160 may transport the container F in which the article is accommodated. The carriage module 160 may be configured to be movable in the vertical direction along the rail module 140. The carriage module 160 may move in the vertical direction along the rail module 140 to carry the container F in which the article is accommodated to the respective layers 11, 12, and 13 of the semiconductor manufacturing line 10. The carriage module 160 may include the carriage 162, the linear motor magnet 164, connection bodies 165a and 165b, a guide part 166, and a power receiving unit 168.

The carriage 162 may have a seating shelf shape on which the container F in which the article is accommodated may be seated. A robot (not illustrated) that grips the container F in which the article is accommodated may be provided to the carriage 162. In FIG. 2, the carriage 162 is illustrated in the shape of a three-stage shelf, but the present invention is not limited thereto, and the shape of the carriage 162 may be variously modified.

The linear motor magnet 164 may be coupled to the carriage 162. The linear motor magnet 164 may move the carriage 162 in the vertical direction by the interaction with the linear motor coil 144. The interaction may be due to magnetic force generated by the linear motor coil 144 and/or the linear motor magnet 164.

Further, the linear motor magnet 164 may generally have a shape of " ᴄ " when viewed from the top. Accordingly, a part of the linear motor coil 144 may be inserted into an opened portion of the linear motor magnet 164.

The connection bodies 165a and 165b may couple the guide part 166, which is to be described below, and the power receiving unit 168 to the carriage 162. The connection bodies 165a and 165b may include a first connection body 165a and a second connection body 165b. The first connection body 165a and the second connection body 165b may have different shapes. The second body 165b may couple the guide part 166 and the power receiving unit 168 to the carriage 162. The first connection body 165a may couple the guide part 166 to the carriage 162.

The guide part 166 may be coupled to the carriage 162 by the connection bodies 165a and 165b. Therefore, when the carriage 162 moves, the guide part 166 may move in the vertical direction together with the carriage 162. The guide part 166 may have a shape surrounding at least a part of the guide rail 146 installed in the frame 142. The guide part 166 may have a shape of " ᴄ " when viewed from the top. The guide rail 146 may be inserted into the guide part 166. Therefore, the guide part 166 may constrain the remaining degrees of freedom except for the degree of freedom of the vertical movement of the carriage module 160 together with the guide rail 146. Further, a gap sensor (not illustrated) is provided to any one of the guide rail 146 and the guide part 166, and the magnetic force may be controlled based on a measurement value measured by the gap sensor. Therefore, an interval between the guide rail 146 and the guide part 166 may be controlled to be substantially constant.

The power receiving unit 168 may receive power transmitted by the power transmitting unit 148. Further, the power receiving unit 168 may be installed to face the power transmitting unit 148. The power receiving unit 168 may be any one of the configurations of the contactless power supply (HID) that supplies power in a contactless manner. The power receiving unit 168 may be coupled with the carriage 162 by means of the second connection body 165b. Therefore, when the carriage 162 moves, the power receiving unit 168 may move in the vertical direction together with the carriage 162.

The carriage module 160 according to the exemplary embodiment of the present invention may include the linear motor magnet 164, and the linear motor magnet 164 may move the carriage 162 along the rail module 140 by the interaction with the linear motor coil 144. That is, the carriage module 160 according to the exemplary embodiment of the present invention may move along the rail module 140 by a magnetic levitation method. In the general tower lift, a carriage module is moved by friction between a timing belt and a pulley, and in this case, particles are generated. However, the carriage module 160 according to the exemplary embodiment of the present invention may move along the rail module 140 by a magnetic levitation method. Accordingly, it is possible to minimize the problem in which the particles are generated.

Further, the carriage module 160 includes the power receiving unit 168, and may receive power from the power transmitting unit 148 by a contactless method. That is, the carriage module 160 may receive power necessary for driving the carriage module 160 by a contactless method. Further, in the present invention, the linear motor coil 144 requiring the connection of the power line is installed in the frame 142, and the carriage module 160 may include the linear motor magnet 164 that does not require the connection of the power line. That is, all of the interface lines, such as the power line, may be connected to the configurations of the rail module 140, and the interface lines may not be connected to the carriage module 160. When the interface lines are connected to the carriage module 160, the connected interface lines act as the factors that hinder the operation of the plurality of carriage modules 160, and the interface lines are not connected to the carriage module 160 according to the exemplary embodiment of the present invention, which thus makes the operation of the plurality of carriage modules 160 easier.

Further, the one pair of linear motor coils 144 of the rail module 140 is provided in plurality, and may be installed in the frame 142 while being spaced apart from each other in the longitudinal direction of the frame 142.

The control unit 600 may control the tower lift 100. The control unit 600 may control the tower lift 100 so that the carriage module 160 is movable along the rail module 140 in the magnetic levitation method. Further, the control unit 600 may include a process controller formed of a microprocessor (computer) executing the control of the tower lift 100, a user interface formed of a keyboard through which the operator performs a command input manipulation and the like for managing the tower lift 100, a display which visualizes and displays an operation of the tower lift 100, and the like, and a storage unit storing a control program for executing the processing executed in the tower lift 100 under the control of the process controller or a program, that is, a processing recipe, for executing the processing on each configuration according to various data and processing conditions. Further, the user interface and the storage unit may be connected to the process controller. The processing recipe may be stored in a storage medium in the storage unit, and the storage medium may be a hard disk, and may also be a portable disk, such as a CD-ROM or a DVD, or a semiconductor memory, such as a flash memory.

As described above, the carriage module 160 according to the exemplary embodiment of the present invention may move along the rail module 140 in the magnetic levitation method. Therefore, when power driving the carriage module 160 is cut, the carriage module 160 may fall (free fall). Therefore, a first braking unit 200 may be installed in the carriage module 160 of the tower lift 100 according to the exemplary embodiment of the present invention. When power driving the tower lift 100 is cut, the carriage module 160 may fall, and the first braking unit 200 may brake the falling of the carriage module 160 even in the state where the power is cut.

Figure 4:
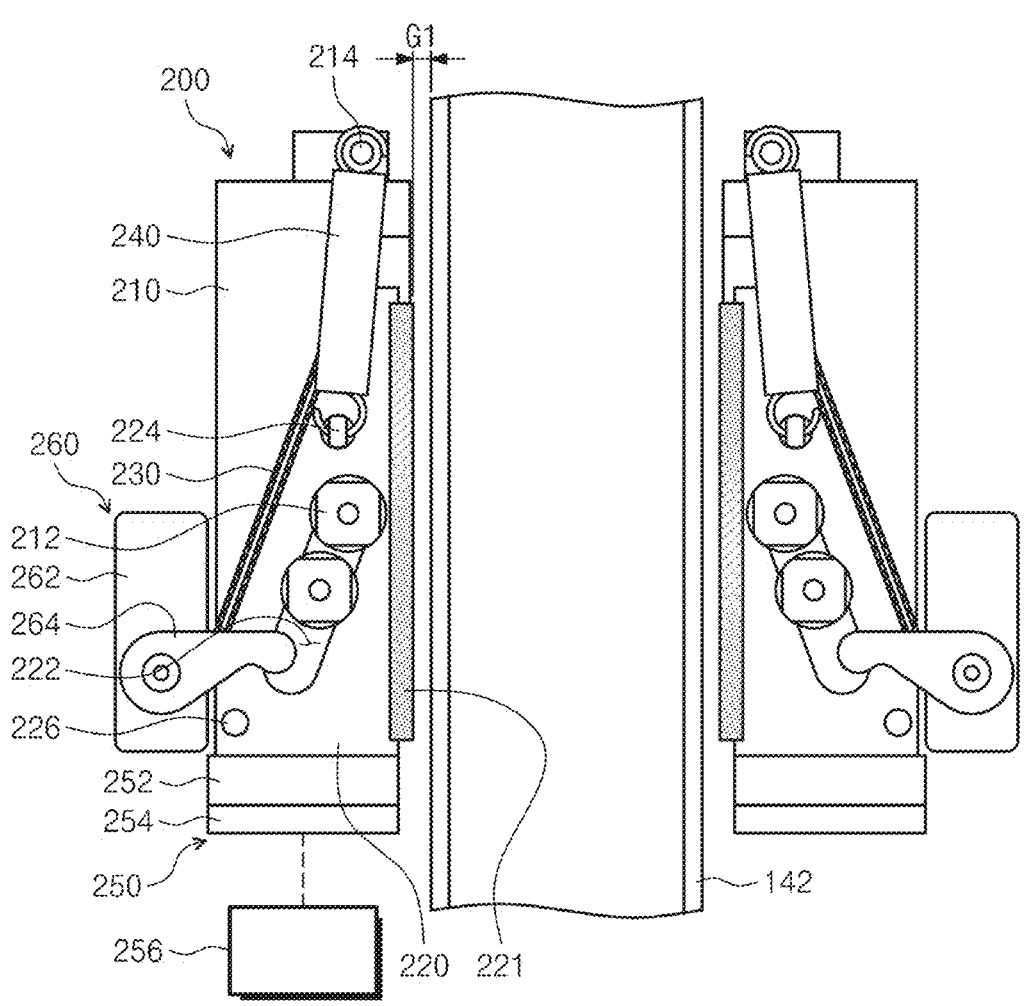
FIG. 4 is a diagram illustrating a braking unit according to the exemplary embodiment of the present invention.

FIG. 4 is a diagram illustrating the braking unit according to the exemplary embodiment of the present invention. In particular, FIG. 4 illustrates the state of the first braking unit 200 in the state where power is applied to the tower lift 100. Referring to FIG. 4, the first braking unit 200 that is the braking unit according to the exemplary embodiment of the present invention may include a first base body 210, a first braking body 220, a sliding roller 230, a first tension member 240, a first holding member 250, and a first restoration member 260.

The relative position of the first base body 210 to the carriage module 160 may be fixed. For example, the first base body 210 may be fixedly coupled to the carriage module 160. A plurality of guide pins 212 inserted into guide holes 222, which are to be described below, may be provided to the first base body 210. The guide pin 212 may be inserted into the guide hole 222 of the first braking body 220, which is to be described below, to guide a movement direction of the first braking body 220. Further, a first base body hooking part 214 may be provided to the first base body 210. In the first base body hooking part 214, a hooking ring that may be one end of the first tension member 240 which is to be described below may be hooked and fixed.

The first braking body 220 may selectively contact with the rail module 140, more particularly, the frame 142 of the rail module 140, to brake the free fall of the carriage module 160. The first braking body 220 may have a right-angled triangular shape in which a corner including an acute angle is cut when viewed from the front.

Further, the first braking body 220 may include a braking pad 221 provided on a surface facing the frame 142 of the rail module 140. A gap G1 between the braking pad 221 and the frame 142 may be about 3 to 5 mm. Further, the guide hole 222 to which the guide pines 212 are insertable may be formed in the first braking body 220. The guide hole 222 may have a long hole shape formed in a direction inclined upward in a direction toward the frame 142. Therefore, the first braking body 220 may move in a direction inclined with respect to the vertical direction. Further, a first braking body hooking part 224 may be provided to the first braking body 220. A hooking ring that may be the other end of the first tension member 240, which is to be described below, may be hooked and fixed to the first braking body hooking part 224.

The slider roller 230 may be provided between the first base body 210 and the first braking body 220. For example, the sliding roller 230 may be provided between the inclined surface of the first braking body 220 and the first base body 210. When the first braking body 220 moves in the inclined direction, the sliding roller 230 helps the first braking body 220 to move more smoothly.

When power is cut, the first tension member 240 may make the first braking body 220 be in contact with the frame 142 of the rail module 140 by moving the first braking body 220 in the upwardly inclined direction. The first tension member 240 may be formed of a tension spring and two rings connected with the tension spring, and any one of the two rings may be hooked and fixed to the first base body hooking part 214, and the other of the two rings may be hooked and fixed to the first braking body hooking part 224.

The first holding member 250 may make the first braking body 200 be selectively in contact with the frame 142 of the rail module 140 by holding the first braking body 220 only when power is applied. For example, the first holding member 250 holds the first braking body 220 in the case where power is applied to the tower lift 100, and may not hold the first braking body 220 in the case where power is applied to the tower lift 100.

Further, the first holding member 250 may include an electromagnet 252 and a holding frame 254. The holding frame 254 may fix the electromagnet 252 to the carriage module 160, and a first power supply 256 driving the tower lift 100 may be connected to the electromagnet 252. For example, when the first power supply 256 applies power to the tower lift 100 and the first braking unit 200, power may be applied to the electromagnet 252 and the electromagnet 252 may generate magnetic force to hold the first braking body 220. In this case, the first braking body 220 may be spaced apart from the frame 142 of the rail module 140.

The first restoration member 260 may move the first braking body 220. For example, the first restoration member 260 may move the first braking body 220 in the downwardly inclined direction. The first restoration member 260 may include a first driver 262 and a first restoration body 264. The first driver 262 may be a motor. The first driver 262 may rotate the first restoration body 264. The first restoration body 264 is formed in the first braking body 220, and may move the first braking body 220 in the downwardly inclined direction by pushing down a restoration protrusion 226 protruding forward.

Figure 5:
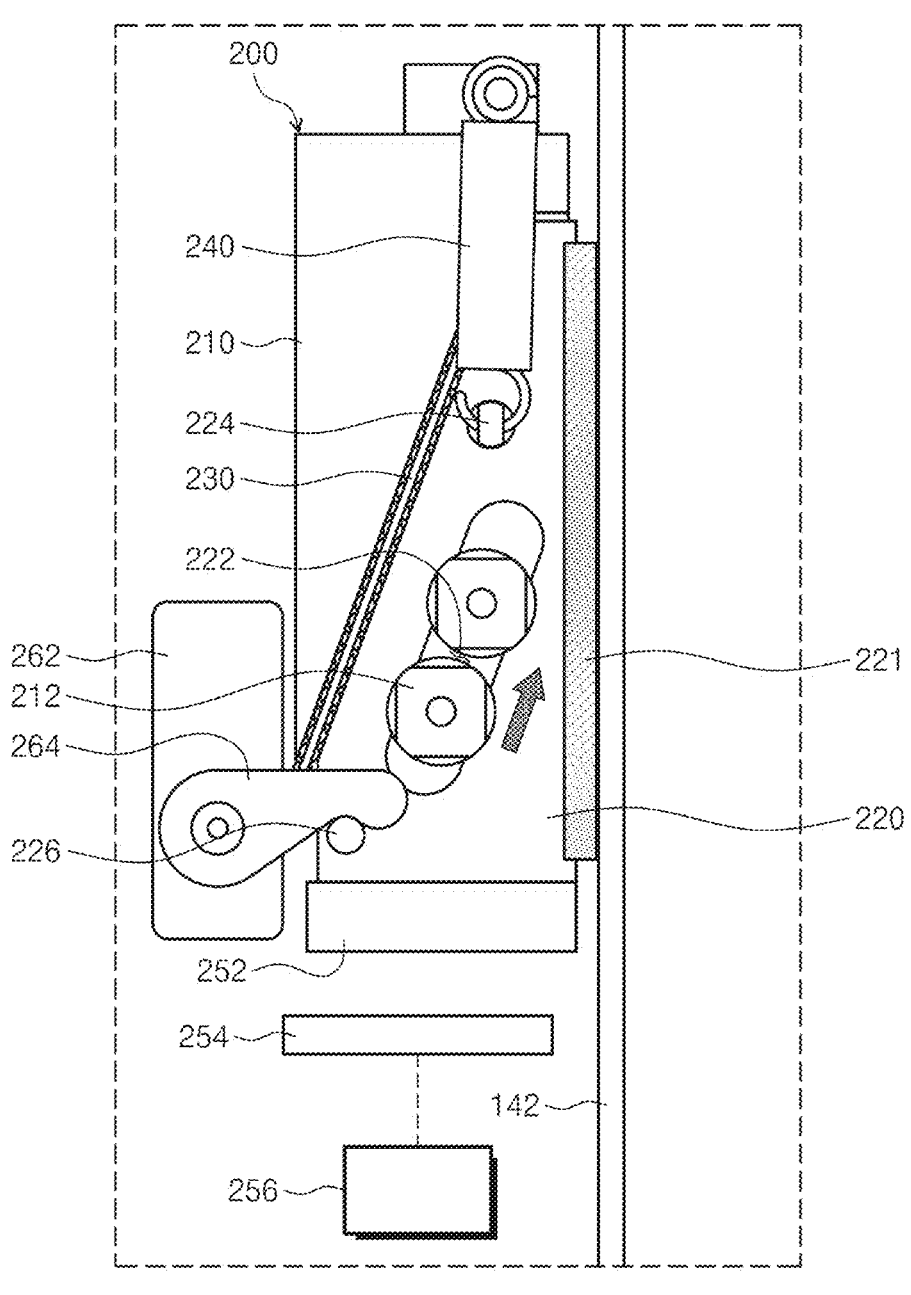
FIG. 5 is a diagram illustrating the state where the braking unit of FIG. 4 brakes the carriage module falling along the rail module.

FIG. 5 is a diagram illustrating the state where the braking unit of FIG. 4 brakes the carriage module falling along the rail module. Referring to FIG. 5, when the power driving the tower lift 100 is cut, the power applied to the electromagnet 252 is also cut. In this case, the electromagnet 252 cannot hold the first braking body 220 because the electromagnet 252 cannot generate magnetic force. Therefore, the first braking body 220 may move in the upwardly inclined direction by the tension force of the first tension member 240. Therefore, the braking pad 221 of the first braking body 220 is in contact with the frame 142 of the rail module 140, and thus, the free fall of the carriage module 160 in which the first braking unit 200 is installed may also be braked.

Figure 6:
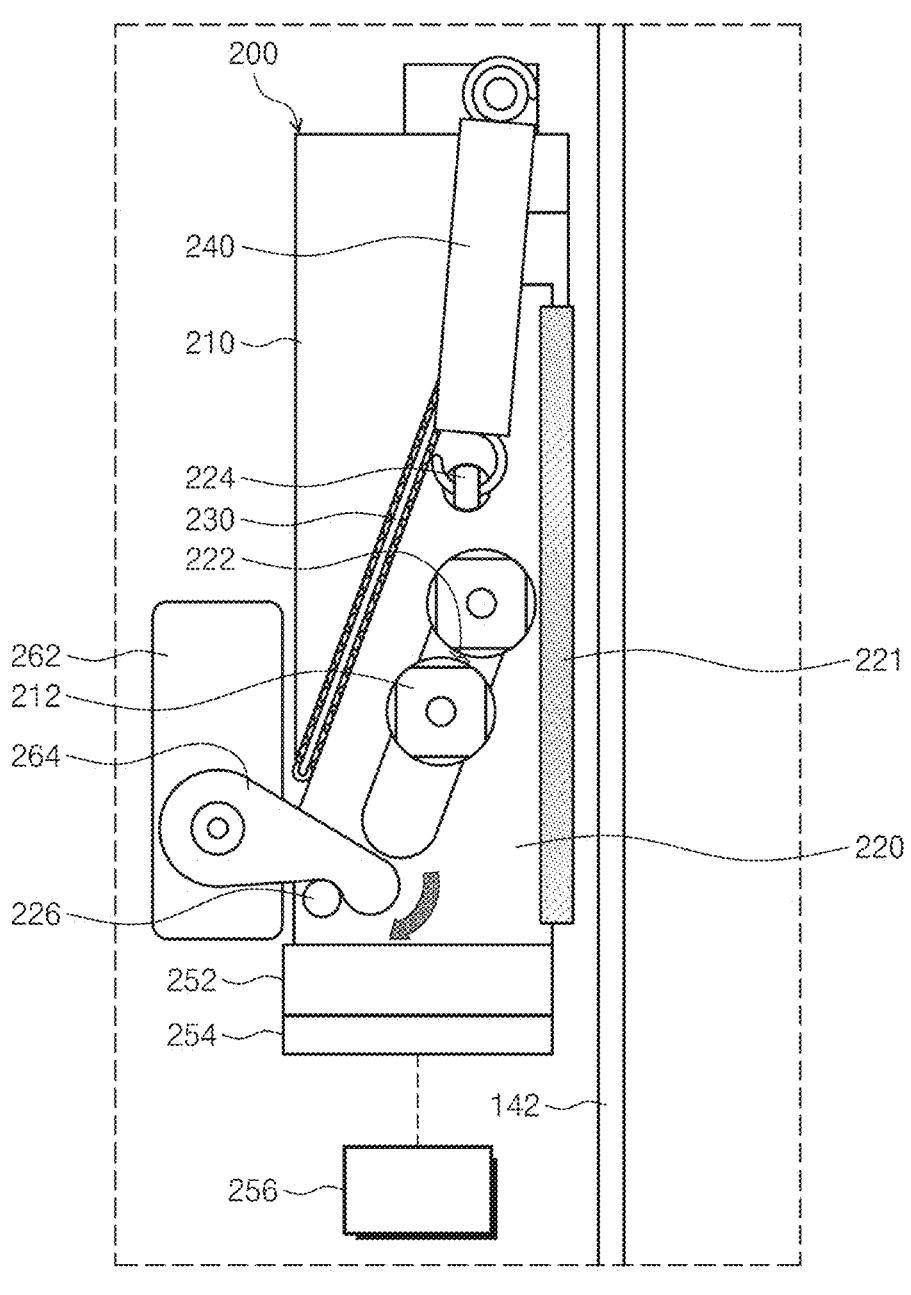
FIG. 6 is a diagram illustrating the state where a braking body of FIG. 4 moves to an original position by a restoration member.

FIG. 6 is a diagram illustrating the state where the braking body of FIG. 4 moves to an original position by a restoration member. Referring to FIG. 6, after the first braking body 220 moves in the upwardly inclined direction and is in contact with the frame 142 of the rail module 140, power may be applied to the tower lift 100 again. In this case, the first restoration body 264 of the first restoration member 260 may be rotated to move the first braking body 220 in the downwardly inclined direction to return the first braking body 220 to the original position. When the first braking body 220 returns to the original position, magnetic force of the electromagnet 252 is generated and thus the first holding member 250 holds the first braking body 220 again.

Figure 7:
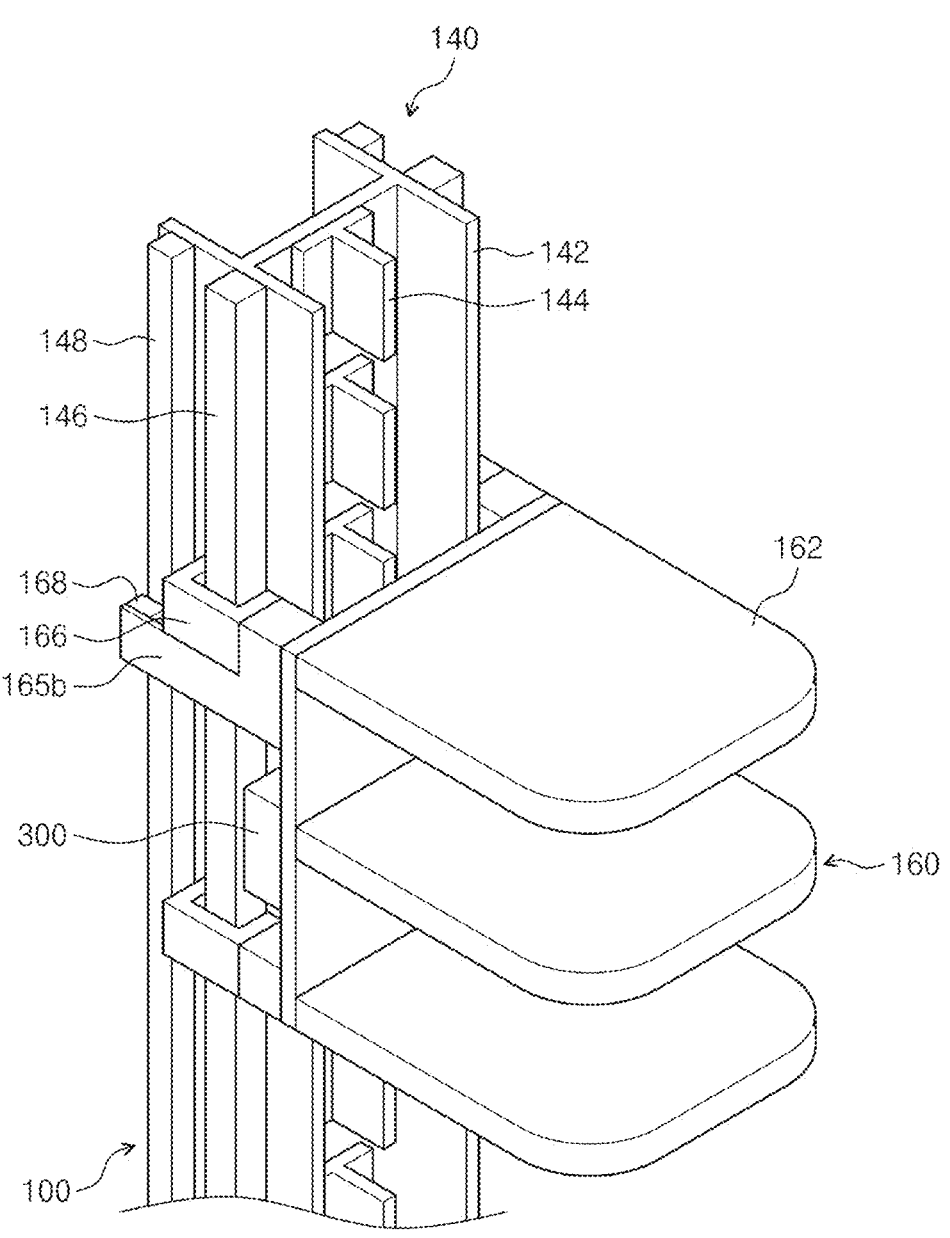
FIG. 7 is a perspective view illustrating a rail module and a carriage module of a tower lift according to another exemplary embodiment of the present invention.

FIG. 7 is a perspective view illustrating a rail module and a carriage module of a tower lift according to another exemplary embodiment of the present invention. Referring to FIG. 7, a second braking unit 300 may be installed in the carriage module 160.

Figure 8:
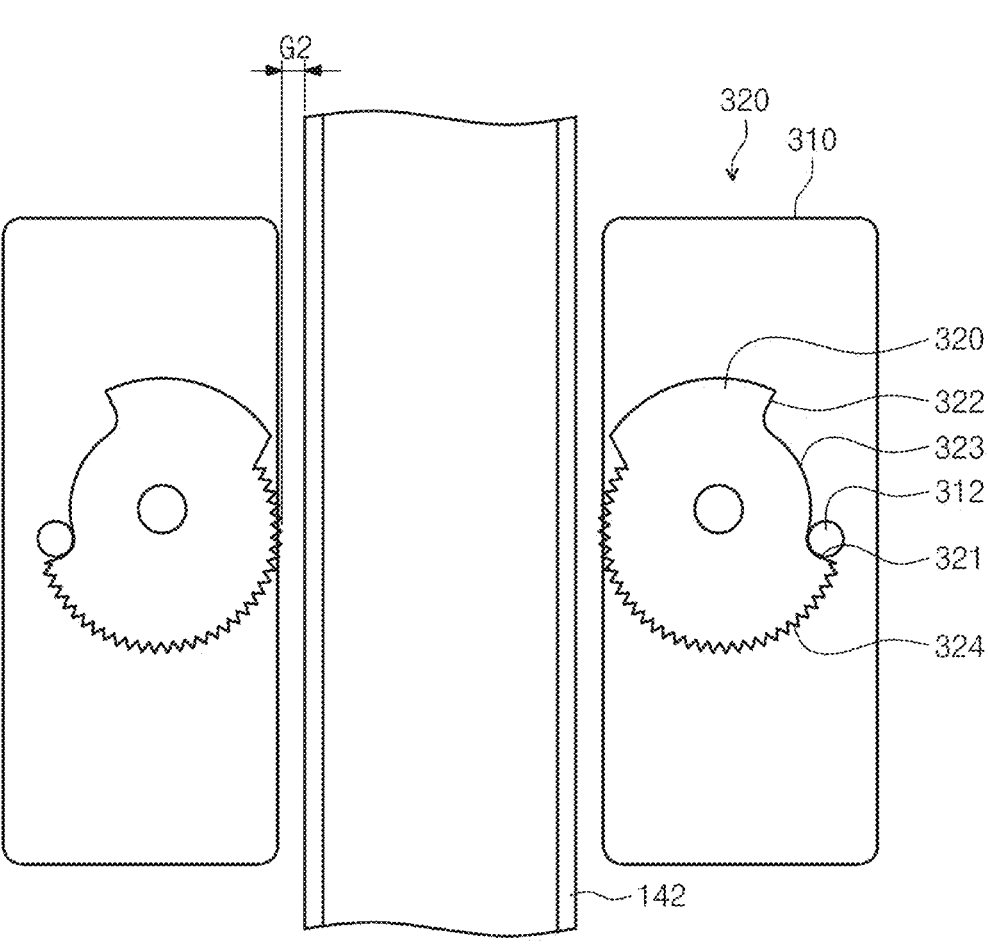
FIG. 8 is a diagram illustrating a braking unit according to another exemplary embodiment of the present invention.
Figure 9:
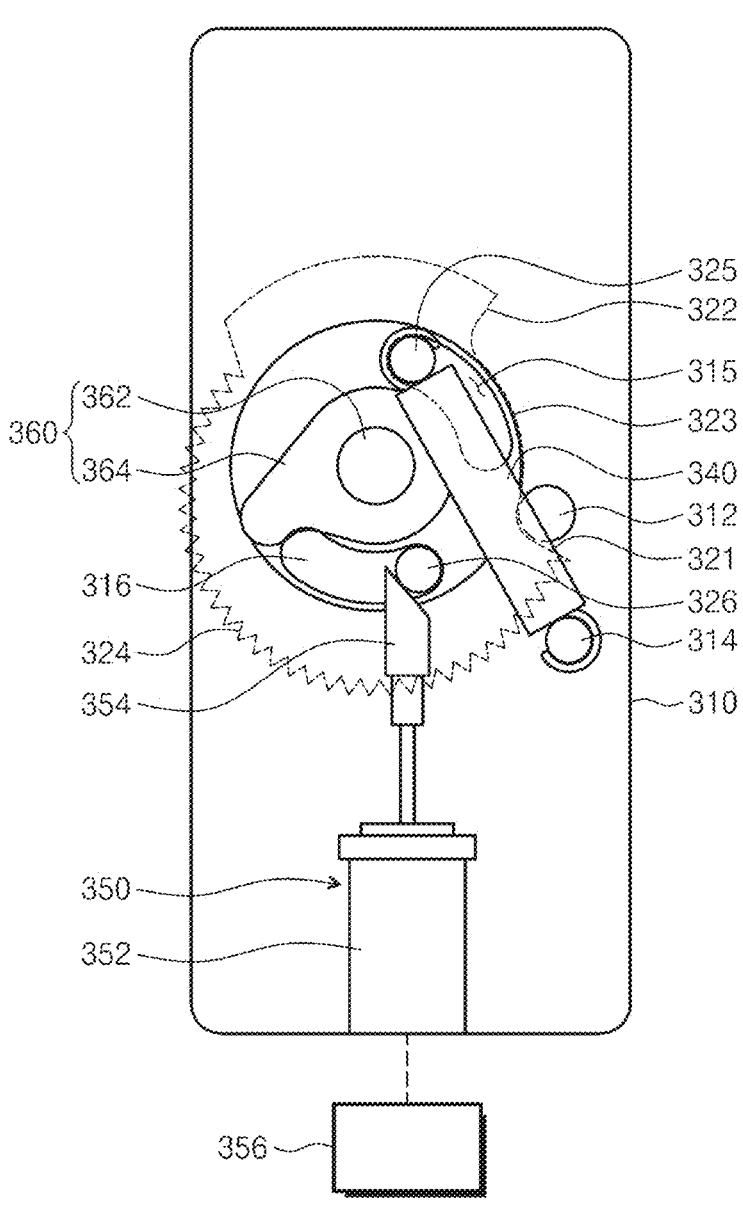
FIG. 9 is a diagram illustrating an internal state of the braking unit of FIG. 8.

FIG. 8 is a diagram illustrating a braking unit according to another exemplary embodiment of the present invention, and FIG. 9 is a diagram illustrating an internal state of the braking unit of FIG. 8. In particular, FIGS. 8 and 9 illustrate the state of the second braking unit 300 in the state where power is applied to the tower lift 100. Further, referring to FIGS. 8 and 9, the second braking unit 300 may include a first base body 310, a second braking body 320, a second tension member 340, a second holding member 350, and a second restoration member 360.

The second base body 310 may be located behind the second braking body 320. For example, the second base body 310 may be positioned closer to a wall W than the second braking body 320. The second base body 310 may be provided with a locking pin 312 on which a first locking end 321 and a second locking end 322 of the second braking body 320, which is to be described below, are caught. The locking pin 312 may protrude in a direction facing the second base body 310.

Further, a first guide groove 315 and a second guide groove 316, which are shaped like an arc, may be formed in the second base body 310 about an axis of rotation on which the second braking body 320 which is to be described below. The second braking body, which is to be described below, may be formed in the first guide groove 315 and the second guide groove 315, and a first guide protrusion 325 and a second guide protrusion 326 protruding from the second braking body 320 in a direction toward the second base body 310 may be inserted into the first guide groove 315 and the second guide groove 315, respectively. Therefore, when the second braking body 320 rotates, the first guide protrusion 325 and the second guide protrusion 326 may move along the first guide groove 315 and the second guide groove 315, respectively.

Further, the second base body 310 may be provided with a second base body hooking part 314 to which a ring, which is one end of the second tension member 340, which is to be described below, is hooked.

The second braking body 320 may be selectively in contact with the frame 142 of the rail module 140 to brake the fall of the carriage module 160. The second braking body 320 may be provided rotatably about the axis of rotation that is horizontal to the ground.

Further, the second braking body 320 may have a cam shape asymmetric with respect to the rotation axis. A sawtooth 324 may be formed on an outer diameter of the second braking body 320 that is in contact with the frame 142 of the rail module 140 by rotating the second braking body 320. Further, in the state where the second braking body 320 is held by the second holding member 350, a gap G2 between the second braking body 320 and the frame 142 may be about 5 mm.

Further, the second braking body 320 includes a first locking end 321 and a second locking end 322, and the first locking end 321 and the second locking end 322 may be caught to the locking pin 312 of the second base body according to the rotation of the second braking body 320. Therefore, the angle at which the second braking body 320 is rotatable may be limited to a setting angle by the first locking end 321, the second locking end 322, and the locking pin 312. Further, a sliding part 323 may be a part that is in contact with the locking pin 312 while the second braking body 320 rotates.

The ring that is one end of the second tension member 340 is hooked and fixed to the first guide protrusion 325, and the ring that is the other end of the second tension member 340 may be hooked and fixed to the second base body hooking part 314 provided to the second base body 310. Therefore, when power supplied to the tower lift 100 is cut, the second tension member 340 may make the second braking body 320 be in contact with the frame 142 of the rail module 140 by rotating the second braking body 320 in a first direction (for example, a clockwise direction in the example illustrated in FIG. 9). The structure of the second tension member 340 is same as or similar to that of the first tension member 240, so that a repeated description will be omitted.

The second holding member 350 holds the rotation of the second braking body 320 in the first direction only when power is applied, so that the second braking body 320 may be selectively in contact with the frame 142 of the rail module 140. The second holding member 350 may include a solenoid 352 and a holding head 354. The solenoid 352 may linearly move the holding head 354. For example, when a second power supply 356 that may be a power supply applying power driving the tower lift 100 applies power to the solenoid 352, the solenoid 352 may move forward the holding head 354. Contrary to this, when power supplied to the solenoid 352 is cut, the solenoid 352 may move backward the holding head 354. Further, the holding head 354 may have an inclined surface. Further, when power is applied to the tower lift 100 and the solenoid 352, the holding head 354 may prevent the second braking body 320 from rotating in the first direction by holding the second guide protrusion 326.

The second restoration member 360 may return the second braking body 320 to an original position by rotating the second braking body 320 in the second direction that is the reverse direction of the first direction after the second braking body 320 rotates in the first direction and is in contact with the frame 142 of the rail module 140. The second restoration member 360 may include a second driver 362 that is a motor, and a second restoration body 364. The second restoration body 364 may rotate in the second direction. The second restoration body 364 may rotate the second braking body 320 in the second direction by rotating the second guide protrusion 326 in the second direction.

Figure 10:
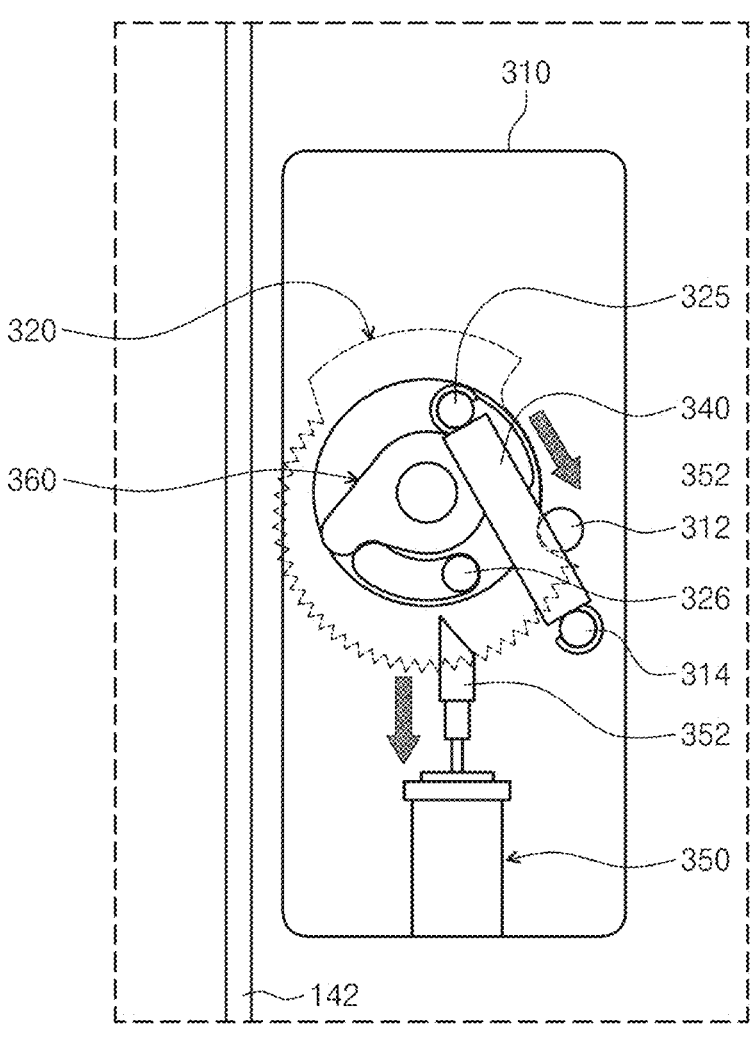
FIG. 10 is a diagram illustrating a state where the braking unit of FIG. 8 rotates in a first direction.

FIG. 10 is a diagram illustrating a state where the braking unit of FIG. 8 rotates in the first direction. Referring to FIG. 10, when power supplied to the tower lift 100 is cut, the holding head 354 moves backwardly. Therefore, the second holding member 350 does not hold the second guide protrusion 326.

Figure 11:
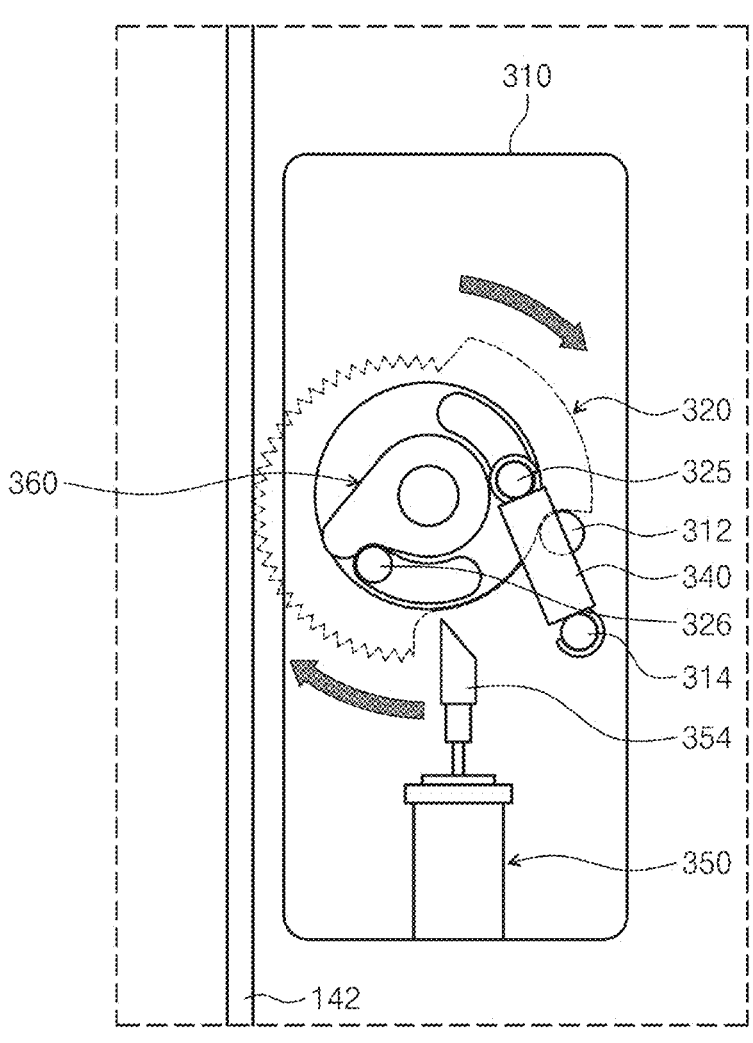
FIG. 11 is a diagram illustrating the state where the braking unit of FIG. 8 brakes the carriage module falling along the rail module.

FIG. 11 is a diagram illustrating the state where the braking unit of FIG. 8 brakes the carriage module falling along the rail module. Referring to FIG. 11, the second holding member 350 does not hold the second guide protrusion 326, so that the tension force of the second tension member 340 may rotate the first guide protrusion 325 in the first direction. Therefore, the a saw-tooth 324 of the second braking body 320 may be in contact with the frame 142. Therefore, the falling of the carriage module 160 may be braked.

Figure 12:
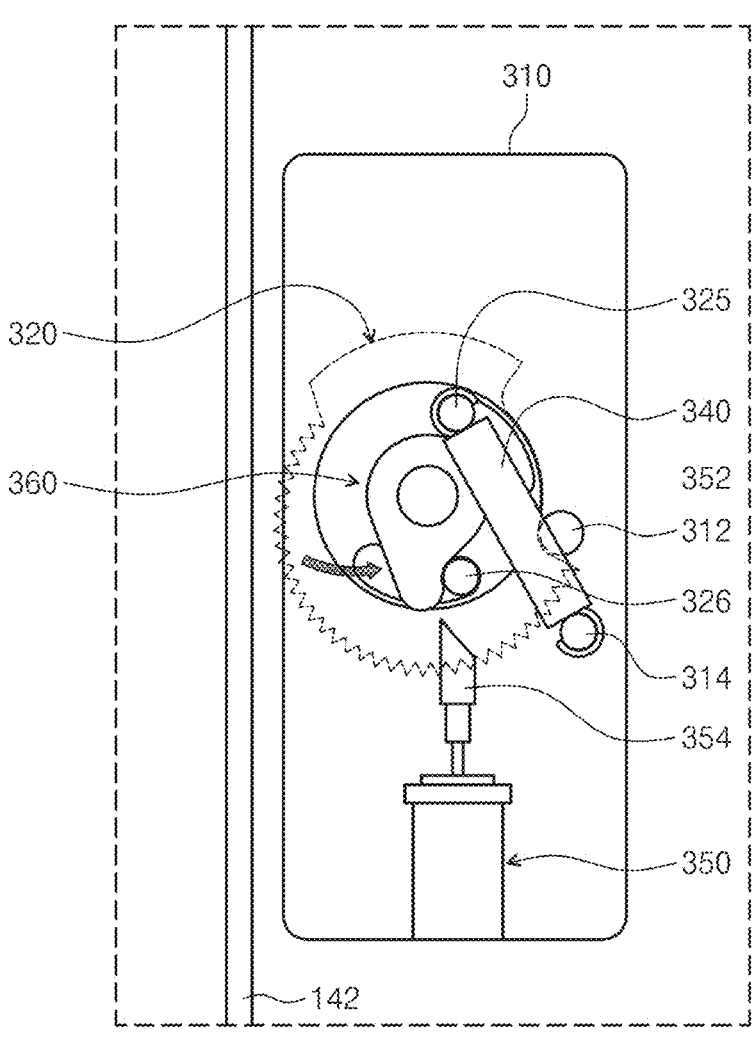
FIGS. 12, 13, and 14 are diagrams illustrating the state where a braking body of FIG. 8 rotates in a second direction by a restoration member and is returned to an original position.
Figure 13:
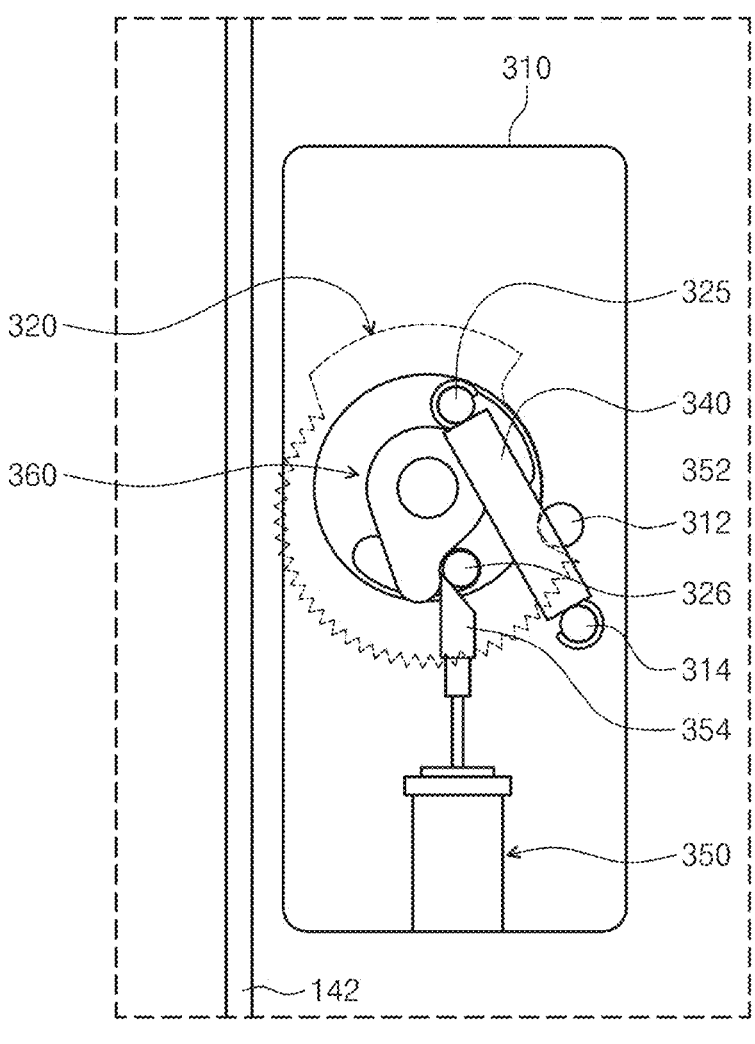
Figure 14:
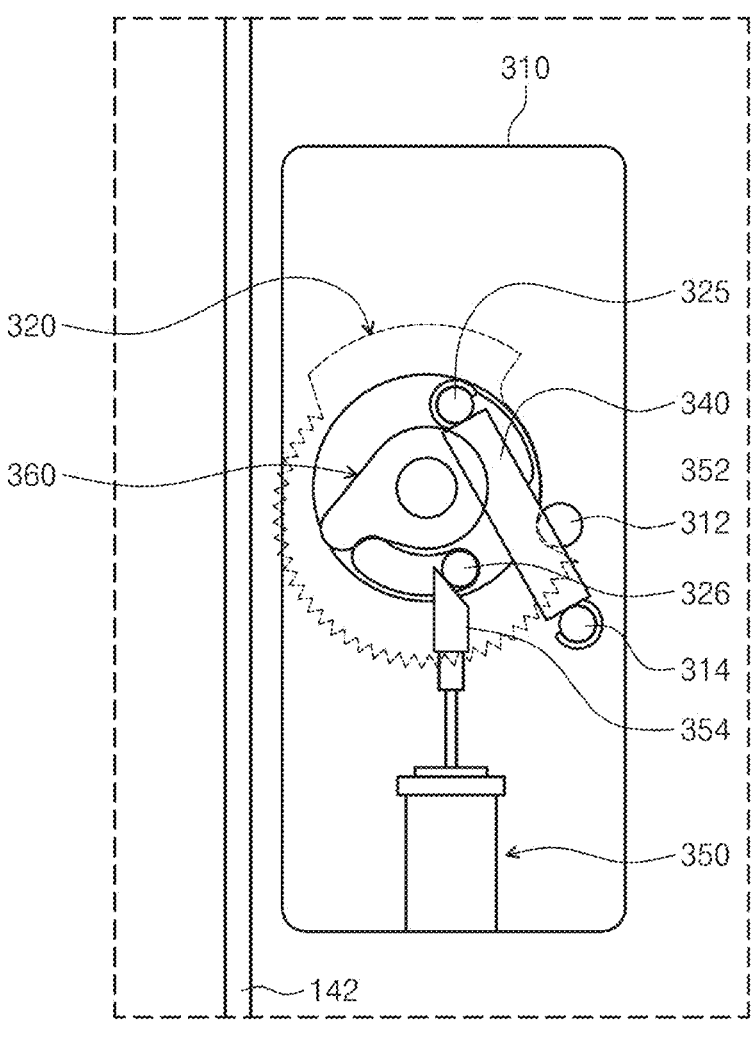

FIGS. 12, 13, and 14 are diagrams illustrating the state where the braking body of FIG. 8 rotates in the second direction by the restoration member and is returned to an original position. When power is applied to the tower lift 100 again, as illustrated in FIG. 12, the second restoration member 360 may rotate the second guide protrusion 326 in the second direction that is the reverse direction of the first direction. Therefore, the second braking body 320 may rotate in the second direction. Then, as illustrated in FIG. 13, a distal end of the holding head 354 may enter between the second guide protrusion 326 and the second restoration body 364. Therefore, the second holding member 350 may hold the rotation of the second braking body 320 again. Thereafter, as illustrated in FIG. 14, the second restoration body 364 may return to the original position.

As described above, the braking units 200 and 300 of the present invention are configured to be in contact with the rail module 140 when power is cut. Therefore, power supplied to the tower lift 100 is cut, so that the falling of the carriage module 160 may be braked.

Figure 15:
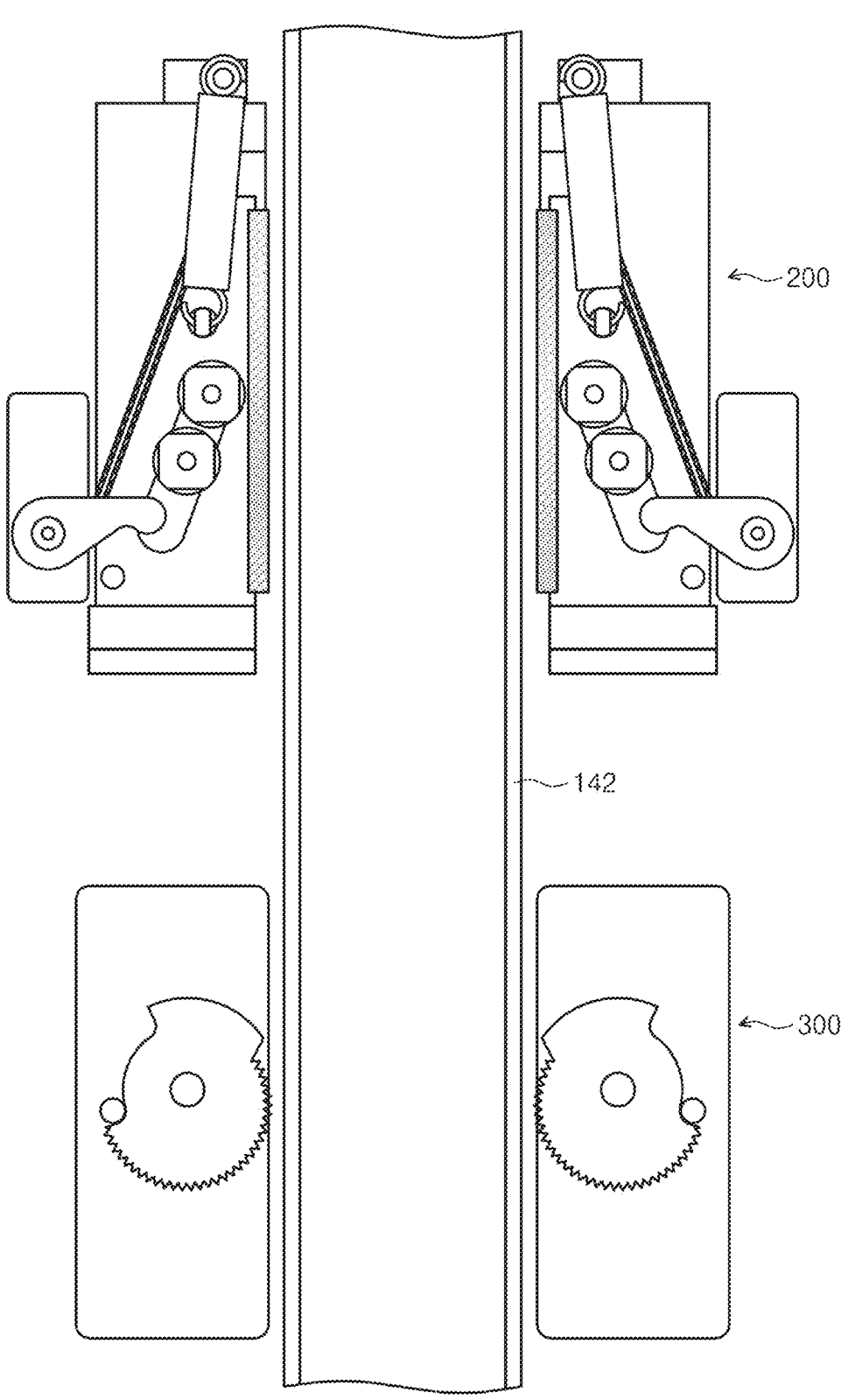
FIG. 15 is a diagram illustrating a tower lift according to another exemplary embodiment of the present invention.

Further, the first braking unit 200 has a large contact area, so that the carriage module 160 is capable of stably braking the falling of the carriage module 160. Further, the second braking unit 300 has an advantage in that the braking distance of the carriage module 160 may be shortened due to the saw-tooth 324. In order to achieve all of the advantages of the first braking unit 200 and the second braking unit 300, both the first braking unit 200 and the second braking unit 300 may be installed in the carriage module 160 as illustrated in FIG. 15. Further, in this case, since the first braking unit 200 has the large contact area, in order to minimize shaking when the carriage module 160 is braked, the first braking unit 200 may be installed at a higher position that the second braking unit 300.

In the foregoing example, the case where the tower lift 100 is provided to the semiconductor manufacturing line has been described as an example, but the present invention is not limited thereto. For example, the tower lift 100 may be equally or similarly applied to various manufacturing lines requiring the transfer of the article.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in the specific application field and use of the present invention are possible. Accordingly, the detailed description of the invention above is not intended to limit the invention to the disclosed exemplary embodiment. Further, the accompanying claims should be construed to include other exemplary embodiments as well.

What is claimed is:

1. A tower lift, comprising:
a rail module extended in a vertical direction; and
a carriage module provided to be movable by a magnetic levitation method along the rail module,
wherein in the carriage module, a braking unit which is configured to brake falling of the carriage module when power driving the tower lift is cut is installed,
wherein the braking unit includes:
a braking body which is selectively in contact with the rail module and is configured to brake falling of the carriage module;
a holding member which is configured to make the braking body be selectively in contact with the rail module by holding the braking body only when the power is applied,
a tension member which is configured to make the braking body be in contact with the rail module by moving the braking body in an upwardly inclined direction when the power is cut; and
a restoration member configured to return the braking body to an original position by moving the braking body in a downwardly inclined direction after the braking body moves in the upwardly inclined direction and is in contact with the rail module,
wherein the braking body is configured to be movable in an inclined direction with respect to the vertical direction, and includes a braking pad provided to a surface facing the rail module.

2. The tower lift of claim 1, wherein the holding member further includes an electromagnet configured to generate magnetic force and holds the braking body so that the braking body is spaced apart from the rail module when the power is applied.

3. The tower lift of claim 1, wherein the braking unit further includes a base body of which a relative position to the carriage module is fixed,
one end of the tension member is fixed to a base body hooking part in the base body, and
another end of the tension member is fixed to a braking body hooking part in the braking body.

4. A braking unit which is installed in a moving object configured to be movable along a rail module extended in a vertical direction by a magnetic levitation method, and configured to brake emergency falling of the moving object in response to power moving the moving object being cut, the braking unit comprising:
a braking body configured to be selectively in contact with the rail module and to brake falling of the moving object, is configured to be movable in an inclined direction with respect to the vertical direction, and includes a braking pad provided to a surface facing the rail module;
a holding member configured to make the braking body be selectively in contact with the rail module by holding the braking body only when the power is applied, and includes an electromagnet configured to generate magnetic force and to hold the braking body so that the braking body is spaced apart from the rail module when the power is applied; and a tension member configured to make the braking body be in contact with the rail module by moving the braking body in an upwardly inclined direction in response to the power being cut.

5. The braking unit of claim 4, further comprising:

a base body fixed to the moving object, wherein one end of the tension member is fixed to a base body hooking part defined in the base body, and another end of the tension member is fixed to a braking body hooking part defined in the braking body.

6. The braking unit of claim 5, further comprising:

a restoration member configured to return the braking body to an original position by moving the braking body in a downwardly inclined direction after the braking body moves in the upwardly inclined direction and is in contact with the rail module.

7. A braking unit which is installed in a moving object configured to be movable along a rail module extended in a vertical direction by a magnetic levitation method, and configured to brake emergency falling of the moving object in response to power moving the moving object being cut, the braking unit comprising:

a braking body configured to selectively be contact with the rail module to brake falling of the moving object, configured to be rotatable about an axis of rotation horizontal to the ground, having a cam shape asymmetric with respect to the axis of rotation, and is has a saw-tooth in an outer diameter that is in contact with the rail module according to a rotation in a first direction;

a holding member configured to make the braking body be selectively in contact with the rail module by holding the braking body only in response to the power being applied, and including a solenoid configured to prevent the braking body from rotating in the first direction in response to the power being applied; and a tension member configured to make the saw-tooth be in contact with the rail module by rotating the braking body in the first direction in response to the power being cut.

8. The braking unit of claim 7, further comprising:

a base body in which an arc-shaped guide groove is defined based on the axis of rotation, wherein a guide protrusion inserted into the guide groove is defined in the braking body, one end of the tension member is fixed to a base body hooking part formed in the base body, and another end of the tension member is fixed to the guide protrusion.

9. The braking unit of claim 8, further comprising:

a restoration member configured to return the braking body to an original position by rotating the braking body in a second direction that is a reverse direction of the first direction after the braking body rotates in the first direction and is in contact with the rail module.

* * * * *